United States Patent
Miranda

[11] Patent Number: 6,098,643
[45] Date of Patent: Aug. 8, 2000

[54] BATH SYSTEM FOR SEMICONDUCTOR WAFERS WITH OBLIQUELY MOUNTED TRANSDUCERS

[76] Inventor: Henry R. Miranda, 3060 Woodside Ter., Fremont, Calif. 94539

[21] Appl. No.: 09/192,148

[22] Filed: Nov. 14, 1998

[51] Int. Cl.[7] .................................................. B08B 3/12
[52] U.S. Cl. ............................... 134/186; 134/902
[58] Field of Search ..................... 134/184, 186, 134/191, 902, 1.3

[56] References Cited

U.S. PATENT DOCUMENTS

| | | |
|---|---|---|
| 2,891,176 | 6/1959 | Branson . |
| 2,985,003 | 5/1961 | Gelfand et al. ........................ 134/184 |
| 2,987,068 | 6/1961 | Branson . |
| 3,056,589 | 10/1962 | Daniel . |
| 3,371,233 | 2/1968 | Cook . |
| 4,167,424 | 9/1979 | Jubenville et al. ....................... 134/1 |
| 4,170,241 | 10/1979 | Clapp ...................................... 134/83 |
| 4,543,130 | 9/1985 | Schwartzman ............................ 134/1 |
| 4,736,760 | 4/1988 | Coberly et al. ........................ 134/134 |
| 4,836,684 | 6/1989 | Javorik et al. ........................ 366/114 |
| 4,886,082 | 12/1989 | Kato et al. ............................. 134/60 |
| 4,909,266 | 3/1990 | Massa .................................... 134/60 |
| 5,038,808 | 8/1991 | Hammnond et al. .................. 134/184 |
| 5,090,432 | 2/1992 | Bran ...................................... 134/139 |
| 5,379,785 | 1/1995 | Ohmori et al. ........................ 134/184 |
| 5,383,484 | 1/1995 | Thomas et al. ........................ 134/184 |
| 5,520,205 | 5/1996 | Guldi et al. ....................... 134/186 X |
| 5,727,578 | 3/1998 | Matthews ................................ 134/61 |
| 5,762,084 | 6/1998 | Krusell et al. ........................ 134/184 |
| 5,813,074 | 9/1998 | Liljeholm ............................. 15/21.1 |

FOREIGN PATENT DOCUMENTS

| | | | |
|---|---|---|---|
| 49619 | 2/1992 | Japan | 134/902 |

*Primary Examiner*—Philip R. Coe
*Attorney, Agent, or Firm*—Townsend and Townsend and Crew LLP

[57] ABSTRACT

A bath system having a container with vertical upper sidewalls, a bottom and oblique walls. Each oblique wall joins the bottom to a sidewall, with ends joining the sidewalls, bottom and oblique walls to form an open enclosure for the container. An inlet is mounted to the bottom so that fresh processing liquid pass in a laminar flow over the surfaces of semiconductor wafers held in the container. High power sonic transducers are mounted to the oblique walls to deliver unimpeded sonic energy to the surfaces of the wafers. In operation, the sonic transducers on each oblique wall are multiplexed so that deleterious interference between the sonic waves from the two oblique walls is avoided.

21 Claims, 2 Drawing Sheets

US 6,098,643

BATH SYSTEM FOR SEMICONDUCTOR WAFERS WITH OBLIQUELY MOUNTED TRANSDUCERS

BACKGROUND OF THE INVENTION

The present invention is related to the field of bath systems for processing semiconductor wafers and, more particularly, bath systems using sonic energy for processing such wafers.

In the present bath systems, a container is loaded with a cassette of semiconductor wafers and a processing liquid is pumped and filtered for recirculation through the container. Processing liquids can be powerful solvents used for chemical actions on the wafer surfaces; on the other hand, simple distilled water may be used as the processing liquid for rinsing operations.

A development in semiconductor bath systems has been the use of sonic energy which is directed against the wafers in the processing liquid. The sonic energy has been found to not only deliver kinetic energy for mechanically "scrubbing" the surfaces of the wafers, but also to help with the desired chemical reaction at the wafer surface/processing liquid interface.

However, bath systems using such sonic energy have not had optimal performance. In some systems, the sonic transducers have been mounted on the outside of the processing container with inefficient and uneven delivery of sonic energy to the wafers. To counter this problem, other systems have placed the sonic transducers on the inside of the processing container thereby exposing the transducers and their electrical connections to the sometimes corrosive properties of the processing liquid. This has sometimes lead to the contamination of the wafers.

Furthermore, such systems have not been able to operate at higher temperatures from the failure of the bonding used to mount the transducers at those temperatures.

Other problems with sonic bath systems have been that energy propagation at different sonic wavelengths, or frequencies, were not accounted for. Such disregard often leaves "dead spots" at which the wafers are not completely exposed to the action of the sonic energy. Conversely, some sonic bath systems operate without any obvious dead spots, but at energies which are not efficient for maximum throughput of the wafers through the semiconductor fabrication facility.

Costs are always of concern in semiconductor production. Typically in a semiconductor fabrication area, there are several bath systems, each of which contains different liquids for processing the semiconductor wafers. The different liquids may include water with varying degrees of chemical contamination for sequentially rinsing the wafers after a processing step. Associated with these bath systems are the purchasing costs for several systems for each fabrication area, and the costs of the processing liquids for the bath systems. There are also the costs associated with the handling of the wafers as they are moved from one bath to another, i.e., the time consumed in moving the wafers and the losses which inevitably occur in handling the wafers.

To overcome these problems, the present invention provides for a bath system in which sonic energy is delivered efficiently and wafer processing time is minimized.

SUMMARY OF THE INVENTION

The present invention provides for a bath system for processing semiconductor wafers. The system has a container for receiving at least one semiconductor wafer and for holding liquid to process the wafer. The container has vertical side walls, a bottom, and oblique walls joining the bottom to the vertical sidewalls. Inlets for liquid are mounted on the bottom so that liquid may be introduced into the container from the bottom. Sonic transducers are attached to each of the oblique walls so that sonic energy may directed across the surface of the wafer unimpeded during processing. In operation, the sonic transducers are operated at high power levels for fast processing times. To avoid the deleterious interference effects, the sonic transducers on each oblique wall are multiplexed.

BRIEF DESCRIPTION OF THE DRAWINGS

A more detailed understanding of the present invention may be achieved by perusing the following Detailed Description Of Preferred Embodiments of the present invention with reference to the following drawings.

DETAILED DESCRIPTION OF PREFERRED EMBODIMENT(S)

Figure 1:
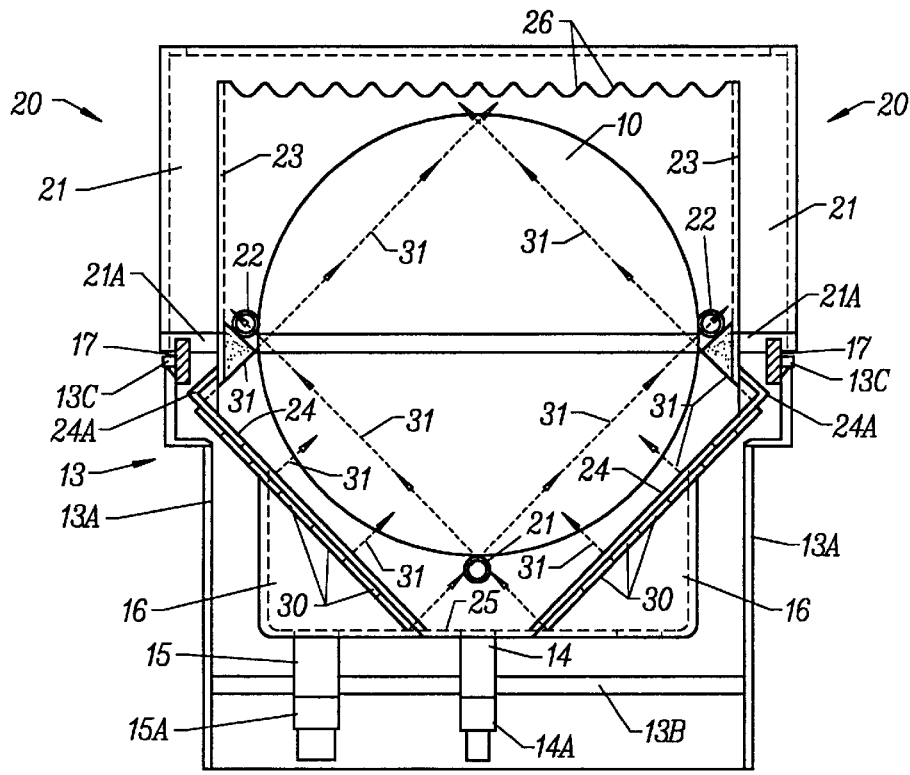
FIG. 1 is a cross-sectional end view of a bath system according to one embodiment of the present invention.

FIG. 1 is a cross-sectional end view of a bath system according to one embodiment of the present. The bath system has two large components, a processing container 10 and a housing 13 to hold the container 20 which, in turn, holds the semiconductor wafers 10. The processing container 20 is typically made of quartz and housing 13 is typically made of plastic. The container 20 rests on and is partially in the housing 13. The housing 13 has side walls 13A and a bottom 13B which receive the bottom half of the container 20. A bottom 21A of a trough 21 of the container 20, discussed in detail below, rests on top edges 13C of the housing 13. Detents 17 which are fixed to the bottom 21A engages the inner sides of the top edges 13C to prevent relative movement between the container 20 and the housing 13.

The container 20 is open at the top with top edges 26 of vertical upper sides 23 formed in a zig-zag or scalloped pattern. Around the patterned top edges 26 of the container 20 is the trough 21 which runs around all four sides 23 of the container 10. See the side view of FIG. 2. The bottom 21A of the trough 21 is slightly inclined so that liquid captured by the trough 21 is fed into an outlet chamber 16, which is located below the level of the trough 21. At the bottom of the outlet chamber 16 is an outlet 15.

The bottom portion of the processing container 20 has a bottom 25 and oblique sides 24 which join the bottom 25 to the upper sides 23. Vertical ends 28 which are joined to the vertical upper sides 23, the bottom 25 and the oblique sides 24 complete the container enclosure. It should be noted that the upper portions 24A of the oblique sides 24 angle back in to join the vertical sides 23. This reduces the volume of the container and reduces the volume of processing liquid in the container. The result is a savings in processing liquid costs, which is significant when the total number of bath systems in a modern semiconductor processing facility is considered.

Figure 2:
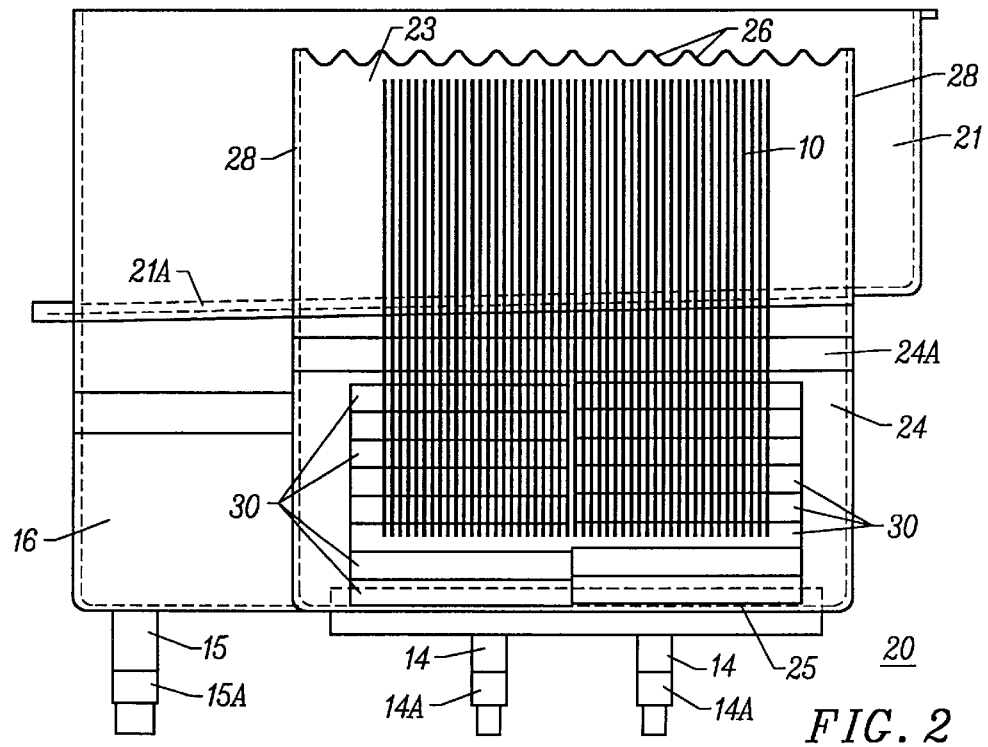
FIG. 2 is a cross-sectional side view of the container in the bath system of FIG. 1.

Through the bottom 25 of the container 20 are mounted inlets 14 through which is pumped the liquid to process the semiconductor wafers 10 held by the container 20. Spargers (not shown) may be used over the inlets 14 for better flow of the processing liquid over the wafers 10. The liquid enters the processing container 20 through the inlets 14 and overflow over the patterned upper edges 26 into the trough 21, the outlet chamber 16 and the outlet 15. The inlets 14 and outlet 15 have screw threads 14A and 15A respectively, to engage tube fittings for tubes to add and remove the processing liquid for the bath system. Two inlets 14, as shown in FIG. 2, help ensure that the flow of the processing liquid over the surfaces of all the wafers 10 is laminar. Such flow ensures the wafer surfaces receive the fresh processing liquid evenly.

Between the ends 28 and parallel to the upper sides 23 are two side wafer mounting rails 22 and a bottom rail 21. The rails 22 and 23 have slots (not shown) which are aligned to hold a semiconductor wafer 10 upright in the container 20. The surfaces of the wafer 10 are held parallel to the container ends 28. As illustrated in FIG. 2, the container 20 holds a plurality of wafers 10, typically 25 in number, for standard semiconductor batch processing practice.

On the outside surfaces of the two oblique sides 24 are bonded banks of sonic transducers 30. As can be seen in FIG. 1, the sonic transducers 30 occupy nearly the complete length of the oblique sides 24 from the bottom 25 to the upper sides 23 for maximum use of the sides 24. The sides 24 are slanted so that the sonic energy from the transducers 30 is delivered across the wafer surfaces in an unimpeded manner. Dotted arrow lines 31 illustrate the path of the sonic energy from on each oblique side 24. As shown in FIG. 1, the oblique sides 24 form a 90° angle with each other so that the central surface portion (where the integrated circuits and other electronics devices are to be formed) of the wafers 10 receive sonic energy from orthogonal directions. If it is desired that all of the wafer surfaces be completely exposed to sonic energy, the container 20 can be easily modified. The lengths of the oblique sides 24 can be increased (with additional sonic transducers 30). In the example of FIGS. 1 and 2, large 300 mm wafers, the so-called 12-inch wafers which have yet to be put into full production, are shown. With smaller standard wafers, such as 250 mm wafers, more of the wafer surfaces are exposed to sonic energy.

In operation, the transducers 30 on each side 24 are multiplexed. That is, the sonic energy is delivered from one side 24, and then the other. This avoids interference between the sonic waves from the two oblique sides 24. Such interference may cause "dead spots" on the wafer surfaces at which no sonic energy is delivered. With the transducers 30 delivering energy from only one side 24 at a time, it is much easier to determine that the sonic waves in traveling across the wafers 10 and reflecting off the sides of the container 20 and the liquid surface at the top edges 26 do not interfere with each other for maximum effect on the wafer surfaces.

This is especially true because the transducers 30 are operated at high power levels, i.e., above 1 W/cm$^2$. In the embodiment described, the transducers 30 are typically operated in a range of 5 to 10 W/cm$^2$ at a frequency range from 500 KHz to 2 MHz. These high power levels significantly lower the time required for processing the wafers 10 in the container 10. Such time savings is directly related to lower costs. At lower energies, deleterious interference is avoided because the reflected sonic energy is highly attenuated. However, processing times are necessarily longer with higher costs.

Figure 3A:
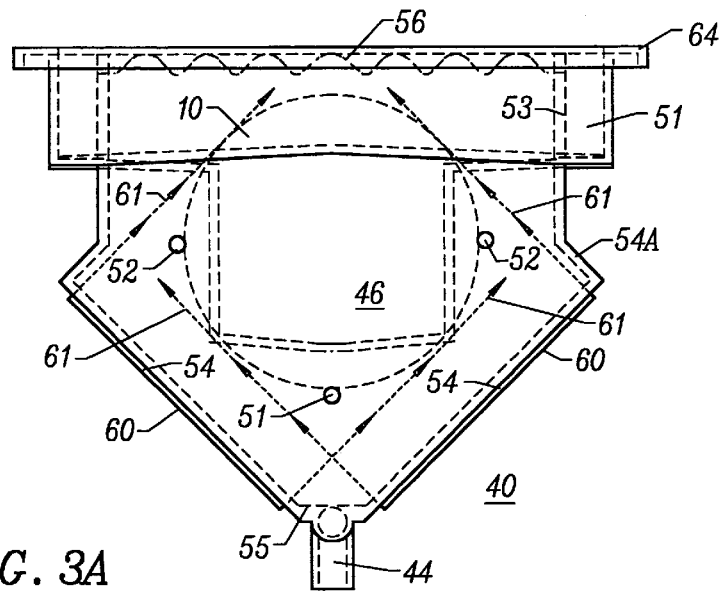
FIG. 3A is a cross-sectional end view of a container according to another embodiment of the present invention.
Figure 3B:
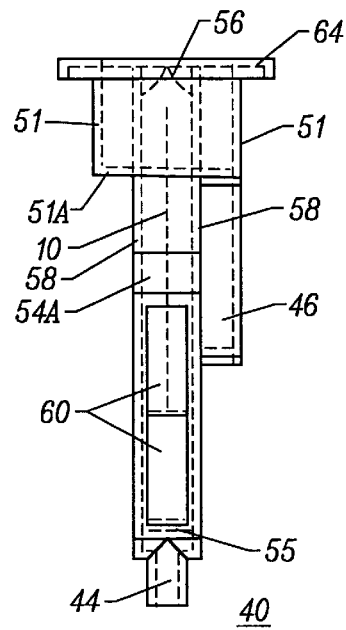
FIG. 3B is a cross-sectional side view of the container of FIG. 3B.
Figure 3C:
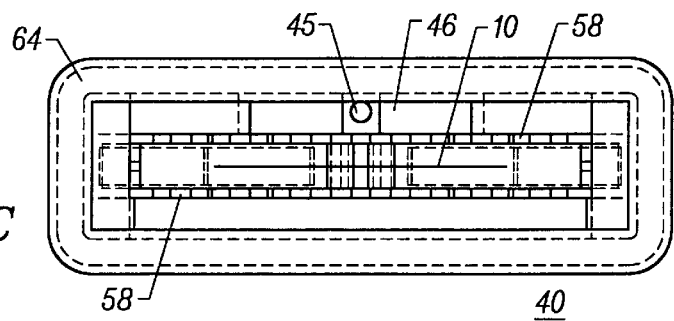
FIG. 3C is a top view of the container of FIG. 3A.

FIGS. 3A–3C illustrate a container 40 for a single semiconductor wafer according to another embodiment of the present invention. Rather requiring the accumulation of a batch of wafers, the container 40 permits a wafer 10 to be processed immediately after a previous processing step has been completed, a procedure which is becoming more and more prevalent in modern semiconductor processing equipment.

The container 40 has the top, zig-zag or scallop patterned, edges 56 of the vertical container sides 53 surrounded by a trough 51. The bottom 51A of the trough 51 is slightly inclined so that liquid captured by the trough 51 is fed into an outlet chamber 46, which is located below the level of the trough 51. At the bottom of the outlet chamber 66 is an outlet 45 (see FIG. 3C), by which the liquid in the outlet chamber 46 is pumped out. The upper edge of the trough 51 has a flange 64 by which the container 40 is mounted on a housing (not shown).

The single semiconductor wafer processing container 40 has the vertical upper sides 53, a bottom 55 and oblique sides 54 joining the bottom 55 to the upper sides 53. Vertical ends 58 are joined to the vertical upper sides 53, the bottom 55 and oblique sides 54 complete the enclosure for the container 50. An inlet 44 is mounted in the bottom 55 through which the process liquid is pumped. The liquid enters the processing container 40 through the inlet 44 and flows over the scalloped upper edges 56 into the trough 51 and outlet chamber 46. The narrowness of the container 40 ensures that the flow of the processing liquid over the surfaces of the wafers 10 is laminar. Such flow ensures the wafer surfaces receive the fresh processing liquid evenly.

Between the ends 58 and parallel to the upper sides 53 are two short side wafer mounting rails 52 and a bottom rail 51. The rails 52 and 53 also have slots (not shown) which are aligned to hold the semiconductor wafer 10 upright in the container 40 so that the surfaces of the wafer 10 are parallel to the container ends 58. On the outside of each of the two oblique sides 54 are bonded high power sonic transducers 60. As in the multiple wafer bath system, the sides 54 are slanted so that the sonic energy from the transducers 60 is delivered across the wafer surfaces in an unimpeded manner. Dotted arrow lines 61 illustrate the path of the sonic energy from on each oblique side 54. As shown in FIG. 3A, the oblique sides 54 form a 90° angle with each other so that the surfaces of the wafer 10 receive sonic energy from orthogonal directions.

Thus the single wafer container 40 has all of the advantages of the multiple wafer container 20 illustrated in FIGS. 1 and 2. Sonic energy is effectively delivered to the two surfaces of the wafer 10 and processing costs are minimized.

While the invention has been particularly shown and described with reference the preferred embodiments, it is understood by those skilled in the art that changes in form and details may be made without departing from the spirit of this invention. It is therefore intended that an exclusive right be granted to the invention as limited only by the metes and bounds of the appended claims.

What is claimed is:

1. A bath system for processing semiconductor wafers comprising a container receiving at least one semiconductor wafer and holding wafer processing liquid, said container having two upper vertical sidewalls, a bottom and two oblique walls, each oblique wall between one of said upper vertical sidewalls and said bottom, said oblique walls tapering down to said bottom so as to provide space for only one inlet in a cross-sectional view of said two upper vertical sidewalls, bottom and two oblique walls;

an inlet mounted to said bottom, said inlet introducing said wafer processing liquid into said container; and at least one sonic transducer attached to each oblique walls on the outside of said container, said sonic transducer on each oblique wall arranged so that energy from said sonic transducer is directed across said wafer during processing.

2. The bath system of claim 1 wherein said sonic transducer delivers power above 1 W/cm$^2$.

3. The bath system of claim 2 wherein said sonic transducer deliver power in the range of 5 to 10 W/cm$^2$.

4. The bath system of claim 1 wherein said at least one sonic transducer on a first oblique wall alternates operation with said at least one sonic transducer on a second oblique wall.

5. The bath system of claim 1 wherein said sonic transducers operate in a frequency range of 500 KHz to 2 MHz.

6. The bath system of claim 1 wherein said container is capable of receiving only one semiconductor wafer.

7. The bath system of claim 1 wherein said oblique walls form a 90° angle with each other.

8. The bath system of claim 1 wherein each oblique wall has an upper portion, said upper portion slanting inward to join an upper vertical sidewall.

9. The bath system of claim 1 further comprising a trough mounted to said upper vertical sidewalls to receive processing liquid overflow.

10. The bath system of claim 1 wherein said oblique walls are nearly occupied by said sonic transducers between said bottom and said upper vertical sidewalls.

11. A bath system for processing semiconductor wafers comprising a container receiving at least one semiconductor wafer and holding wafer processing liquid, said container having two upper vertical sidewalls, a bottom and two oblique walls, each oblique wall between one of said upper vertical sidewalls and said bottom, said oblique walls forming a 90° angle with each other, said oblique walls extending between said bottom and said upper vertical sidewalls by a first width, said bottom extending between said oblique walls by a second width much less than said first width so that energy from said at least one sonic transducer is directed across most of said wafer;

an inlet mounted to said bottom, said inlet introducing said wafer processing liquid into said container; and at least one sonic transducer attached to each oblique walls on the outside of said container, said sonic transducer on each oblique wall arranged so that energy from said at least one sonic transducer on an oblique wall is directed across said wafer and not toward the other oblique wall during processing.

12. The bath system of claim 10 wherein said at least one sonic transducer on a first oblique wall alternates operation with said at least one sonic transducer on a second oblique wall.

13. The bath system of claim 11 wherein said container is capable of receiving only one semiconductor wafer.

14. The bath system of claim 11 wherein each oblique wall has an upper portion, said upper portion slanting inward to join an upper vertical sidewall.

15. The bath system of claim 1 wherein said at least one sonic transducer on a first oblique wall alternates operation with said at least one sonic transducer on a second oblique wall so as to avoid interference across said wafer during processing.

16. A bath system for processing semiconductor wafers comprising a container receiving at least one semiconductor wafer and holding wafer processing liquid, said container having two upper vertical sidewalls, a bottom and two oblique walls, each oblique wall between one of said upper vertical sidewalls and said bottom, each oblique wall having an upper portion, said upper portion slanting inward to join an upper vertical sidewall;

an inlet mounted to said bottom, said inlet introducing said wafer processing liquid into said container; and at least one sonic transducer attached to each oblique walls on the outside of said container, said sonic transducer on each oblique wall arranged so that energy from said sonic transducer is directed across said wafer during processing.

17. The bath system of claim 16 wherein said at least one sonic transducer on a first oblique wall operation with said at least one sonic transducer on a second oblique wall so as to avoid interference across said wafer during processing.

18. The bath system of claim 17 wherein said at least one sonic transducer on a first oblique wall alternates operation with said at least one sonic transducer on a second oblique wall.

19. The bath system of claim 16 wherein said container is capable of receiving only one semiconductor wafer.

20. The bath system of claim 16 wherein said oblique walls form a 90° angle with each other.

21. The bath system of claim 16 wherein each oblique wall has an upper portion, said upper portion slanting inward to join a vertical sidewall.

* * * * *